(12) United States Patent
An et al.

(10) Patent No.: US 10,996,958 B2
(45) Date of Patent: May 4, 2021

(54) TEST BOARD AND A DEVICE TESTING APPARATUS USING THE TEST BOARD

(71) Applicant: SAMSUNG ELECTRONICS CO., LTD., Suwon-si (KR)

(72) Inventors: Jong Jin An, Asan-si (KR); Jae Hyun Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 50 days.

(21) Appl. No.: 16/573,460

(22) Filed: Sep. 17, 2019

(65) Prior Publication Data

US 2020/0257536 A1    Aug. 13, 2020

(30) Foreign Application Priority Data

Feb. 12, 2019   (KR) ........................ 10-2019-0015834

(51) Int. Cl.
*G06F 9/38* (2018.01)
*G01R 31/28* (2006.01)

(52) U.S. Cl.
CPC ....... *G06F 9/3844* (2013.01); *G01R 31/2849* (2013.01); *G01R 31/2867* (2013.01); *G01R 31/2874* (2013.01); *G01R 31/2879* (2013.01); *G01R 31/2886* (2013.01)

(58) Field of Classification Search
CPC .............. G06F 9/3844; G01R 31/2849; G01R 31/2867; G01R 31/2874; G01R 31/2879; G01R 31/2886

USPC ........................................................ 333/125
See application file for complete search history.

(56) References Cited

U.S. PATENT DOCUMENTS

| | | | |
|---|---|---|---|
| 9,804,195 B2 | 10/2017 | Neuhauser | |
| 2017/0133736 A1 | 5/2017 | Kim et al. | |
| 2017/0229757 A1 | 8/2017 | Lee et al. | |

FOREIGN PATENT DOCUMENTS

| | | |
|---|---|---|
| JP | 2000292491 | 10/2000 |
| KR | 10-2006-0104392 | 10/2006 |
| KR | 10-0930989 | 12/2009 |
| KR | 10-0950019 | 3/2010 |

*Primary Examiner* — Robert J Pascal
*Assistant Examiner* — Kimberly E Glenn
(74) *Attorney, Agent, or Firm* — F. Chau & Associates, LLC

(57) ABSTRACT

A test board is provided including a first branch line including a first portion which receives an input signal and a second portion opposite to the first portion. A plurality of second branch lines branch from the first branch line. Each of the second branch lines include a third portion connected to the second portion of the first branch line and a fourth portion connected to the third portion. A first characteristic impedance of the first portion of the first branch line is different from a second characteristic impedance of the second portion of the first branch line. A third characteristic impedance of the third portions of each of the second branch lines is different from a fourth characteristic impedance of the fourth portions of each of the second branch lines. The second characteristic impedance is equal to a combined characteristic impedance of the third portions of each of the second branch lines.

20 Claims, 13 Drawing Sheets

TEST BOARD AND A DEVICE TESTING APPARATUS USING THE TEST BOARD

CROSS REFERENCE TO RELATED APPLICATION

This application claims priority under 35 U.S.C. § 119 to Korean Patent Application No. 10-2019-0015834, filed on Feb. 12, 2019, the disclosure of which is incorporated by reference herein in its entirety.

TECHNICAL FIELD

The present disclosure relates to a test board, and more specifically, to a test board a device testing apparatus using the test board.

DISCUSSION OF THE RELATED ART

In order to increase test efficiency and reduce test time when using automatic test equipment (ATE), multiple semiconductor devices are connected to a single ATE to perform testing. In this case, a test signal transmitted by the ATE is received via one or more transmission paths and is then branched and transmitted to each of the semiconductor devices.

However, an impedance mismatch may occur at a point where the test signal is branched. This causes an increase in a reflection coefficient and results in distortion of signals due to reflection loss. Thus, in order to increase product yield, an impedance matching device capable of minimizing such reflection loss when testing the semiconductor devices may be used.

SUMMARY

Embodiments of the present disclosure provide for a test board including branch lines capable of minimizing reflection loss within the range between maximum and minimum characteristic impedances.

According to an exemplary embodiment of the present inventive concept, a test board is provided including a first branch line including a first portion which receives an input signal and a second portion opposite to the first portion. A plurality of second branch lines branch from the first branch line. Each of the second branch lines include a third portion connected to the second portion of the first branch line and a fourth portion connected to the third portion. A first characteristic impedance of the first portion of the first branch line is different from a second characteristic impedance of the second portion of the first branch line. A third characteristic impedance of the third portions of each of the second branch lines is different from a fourth characteristic impedance of the fourth portions of each of the second branch lines. The second characteristic impedance is equal to a combined characteristic impedance of the third portions of each of the second branch lines.

According to an exemplary embodiment of the present inventive concept, a test board is provided including first and second output lines connected to first and second target devices, respectively, which have equal characteristic impedance. A first branch line is provided including a first portion receiving an input signal and a second portion disposed opposite to the first portion. A second branch line including a third portion is connected to the second portion and a fourth portion is connected to the first and second output lines. A maximum characteristic impedance of the first and second output lines and the first and second branch lines is at least twice a minimum characteristic impedance of the first and second output lines and the first and second branch lines. A fourth characteristic impedance of the fourth portion is half of a characteristic impedance of the first and second branch lines. A third characteristic impedance of the third portion is at least twice the minimum characteristic impedance and less than or equal to the maximum characteristic impedance, and a second characteristic impedance of the second portion is half of the third characteristic impedance.

According to an exemplary embodiment of the present inventive concept, a device testing apparatus includes a tester providing an input signal and a test board receiving the input signal, branching the input signal and then providing branched input signals to a plurality of target devices. The test board includes an input line which receives the input signal, a first branch line which is branched off of the input line, a second branch line which is branched off of the first branch line, and an output line which is branched off of the second branch line and is connected to the plurality of target devices. The first branch line includes a first portion which is connected to the input line and a second portion which is connected to the second branch line. The second branch line includes two or more third portions which are connected to the first branch line and a fourth portion which is connected to the output line. A characteristic impedance of the first portion is different from a characteristic impedance of the second portion. A characteristic impedance of the third portion is different from a characteristic impedance of the fourth portion. The characteristic impedance of the first portion is equal to a characteristic impedance of the input line, and the characteristic impedance of the second portion is equal to the combined characteristic impedance of the two or more third portions.

BRIEF DESCRIPTION OF THE DRAWINGS

The above and other features of the present inventive concept will become more apparent by reference to the following detailed description when considered in conjunction with the attached drawings, in which.

DETAILED DESCRIPTION OF THE EMBODIMENTS

Figure 1:
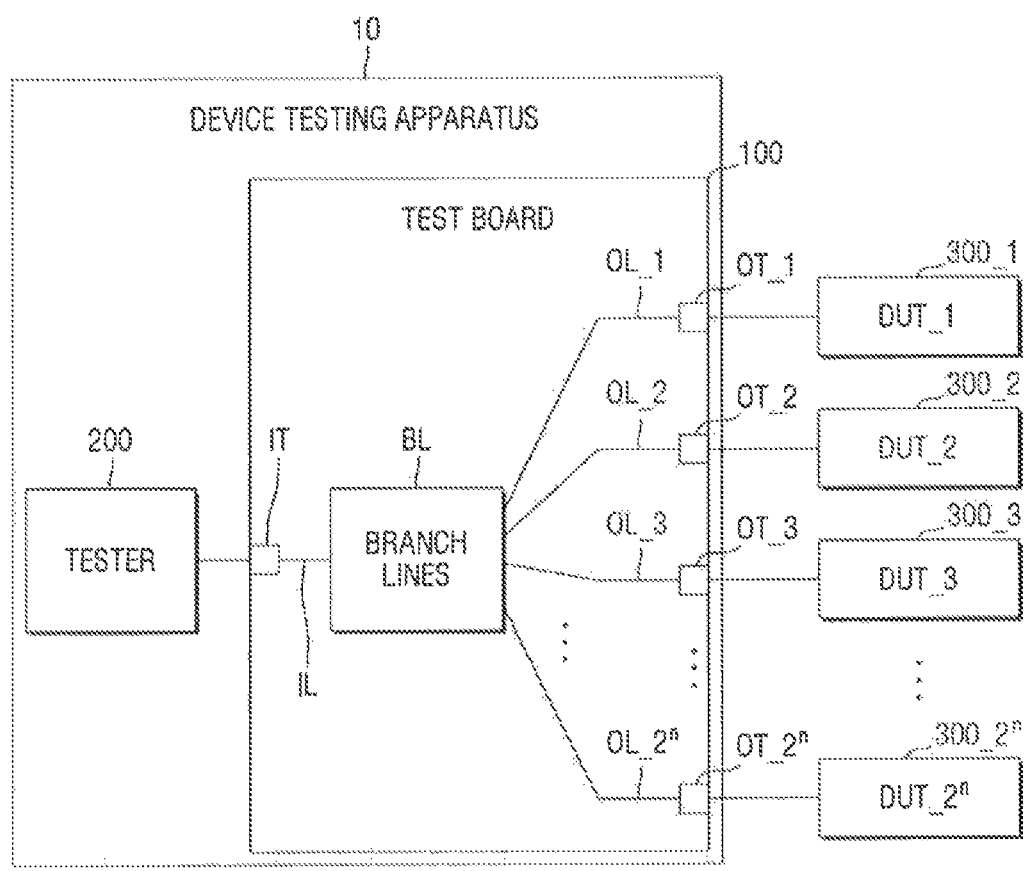
FIG. 1 is a block diagram illustrating a device testing apparatus according to an exemplary embodiment of the present inventive concept.

FIG. 1 is a block diagram of a device testing apparatus according to an exemplary embodiment of the present inventive concept.

Referring to FIG. 1, a device testing apparatus 10 may include a test board 100 and a tester 200.

The test board 100 may include an input line IL, branch lines BL, first through $2^n$-th output lines OL_1 through OL_$2^n$, an input terminal IT, and first through $2^n$-th output terminals OT_1 through OT_$2^n$.

The input line IL may be connected to the input terminal IT. The input line IL may receive an input signal provided to the input terminal IT. The input line IL may be branched into the first through $2^n$-th output terminals OT_1 through OT_$2^n$ through the branch lines BL. The first through $2^n$-th output lines OL_1 through OL_$2^n$ may be connected to the first through $2^n$-th output terminals OT_1 through OT_$2^n$, respectively.

According to an exemplary embodiment of the present inventive concept, the input line IL, the branch lines BL, and the first through $2^n$-th output lines OL_1 through OL_$2^n$ may be striplines and/or micro-striplines. The strip lines and/or micro-striplines will hereinafter be described with reference to FIGS. 2 and 3.

Figure 2:
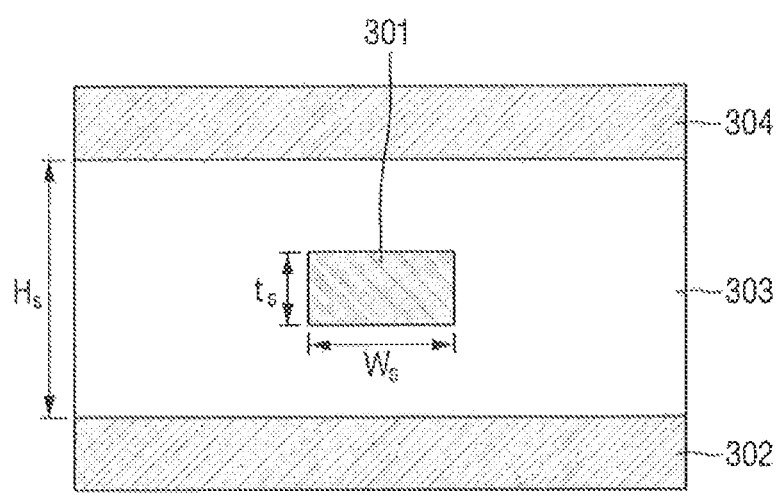
FIG. 2 is a diagram illustrating a stripline, according to an exemplary embodiment of the present inventive concept.
Figure 3:
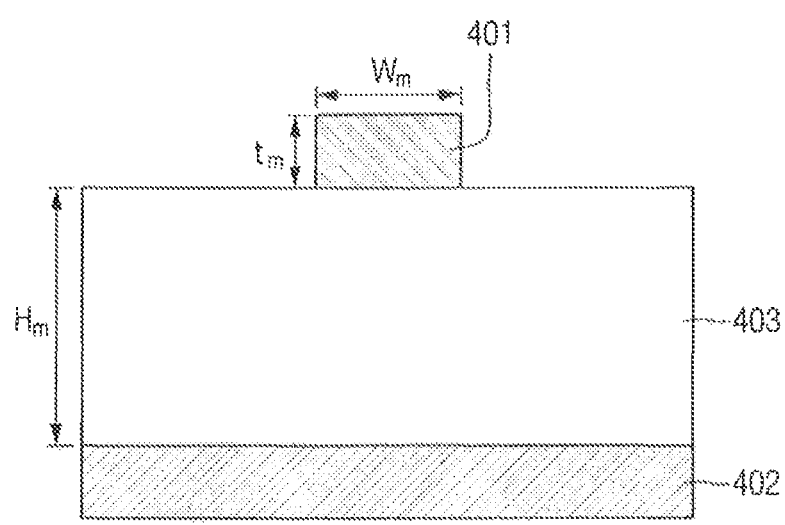
FIG. 3 is a diagram illustrating a micro-stripline, according to an exemplary embodiment of the present inventive concept.

FIG. 2 illustrates a stripline, according to an exemplary embodiment of the present inventive concept. FIG. 3 illustrates a micro-stripline, according to an exemplary embodiment of the present inventive concept.

Referring to FIG. 2, a stripline may include a first signal electrode 301, a first ground electrode 302, a second ground electrode 304, and a first dielectric 303.

The first signal electrode 301, the first ground electrode 302, and the second ground electrode 304 may include copper (Cu), aluminum (Al), silver (Ag), brass, tungsten (W), nickel (Ni), ruthenium oxide (RuO), tantalum nitride ($Ta_xN$), nickel-chromium (NiCr), and/or an alloy thereof, but the present inventive concept is not limited thereto. The first dielectric 303 may include, for example, an FR4 epoxy and/or ceramic, but the present inventive concept is not limited thereto.

The first signal electrode 301, the first ground electrode 302, and the second ground electrode 304 may have a plate shape (e.g., a rectangular shape) collectively and/or individually. For example, the first signal electrode 301, the first ground electrode 302, and the second ground electrode 304 may be solid plates and/or printed circuit patterns. The first signal electrode 301, the first ground electrode 302, and the second ground electrode 304 may be arranged to substantially in parallel to one another. For example, the first signal electrode 301 may extend between, and in parallel to the first and second ground electrodes 302 and 304. The first signal electrode 301 may be included in the first dielectric 303. The first and second ground electrodes 302 and 304 may be disposed on one side and the other side, respectively, of the first dielectric 303. For example, the first and second ground electrodes 302 and 304 may be disposed at parallel long sides of the first dielectric 303. The first signal electrode 301 may be provided with, for example, the input signal, and the first and second ground electrodes 302 and 304 may be provided with, for example, a ground signal.

A characteristic impedance $Z_{0\_strip}$ of the stripline may be approximated by Equation (1):

$$Z_{0\_strip} = \frac{60}{\sqrt{\varepsilon_{rs}}} \ln\left[\frac{1.9(H_s)}{(0.8W_s + t_s)}\right] \quad (1)$$

$H_s$ denotes the thickness of the first dielectric 303, e.g., the distance between the first and second ground electrodes 302 and 304, $\varepsilon_{rs}$ denotes the relative dielectricity of the first dielectric 303, and $t_s$ and $W_s$ denote the thickness and the linewidth, respectively, of the first signal electrode 301.

As is clear from Equation (1) included above, there is an exponential inverse relationship between the characteristic impedance $Z_{0\_strip}$ of the stripline and the linewidth $W_s$ of the first signal electrode 301. For example, as the sum of the line width $W_s$ and the thickness $t_s$ of the first signal electrode 301 increases, the characteristic impedance $Z_{0\_strip}$ of the stripline decreases exponentially.

Similarly, referring to FIG. 3, a micro-stripline may include a second signal electrode 401, a third ground electrode 402, and a second dielectric 403.

The second signal electrode 401 and the third ground electrode 402 may include, for example, Cu, Al, Ag, brass, W, Ni, RuO, $Ta_xN$, NiCr, and/or an alloy thereof, but the present inventive concept is not limited thereto. The second dielectric 403 may include an FR4 epoxy 13 and/or ceramic, but the present inventive concept is not limited thereto.

The second dielectric 403 may be disposed between the second signal electrode 401 and the third ground electrode 402. For example, the second signal electrode 401 may be disposed on one surface of the second dielectric 403, and the third ground electrode 402 may be disposed on the other surface of the second dielectric 403. For example, the second signal electrode 401 may be spaced apart from, and extend in parallel to, the third ground electrode 402. The second signal electrode 401 may be provided with, for example, the input signal, and the third ground electrode 402 may be provided with, for example, a ground signal.

A characteristic impedance $Z_{0\_mstrip}$ of the micro-stripline may be approximated by Equation (2):

$$Z_{0\_mstrip} = \frac{87}{\sqrt{\varepsilon_{rm} + 1.41}} \ln\left[\frac{5.98(H_m)}{(0.8W_m + t_m)}\right] \quad (2)$$

where $H_m$ denotes the thickness of the second dielectric 403, e.g., the distance between the second signal electrode 401 and the third ground electrode 402, $\varepsilon_{rm}$ denotes the relative dielectricity of the second dielectric 403, and $t_m$ and $W_m$ denote the thickness and the linewidth, respectively, of the second signal electrode 401.

As is clear from Equation (2) included above, there is an exponential inverse relationship between the characteristic impedance $Z_{0\_mstrip}$ of the micro-stripline and the linewidth $W_m$ of the second signal electrode 401. For example, as the sum of the line width $W_m$ and the thickness $t_m$ of the second signal electrode 401 increases, the characteristic impedance $Z_{0\_mstrip}$ of the micro-stripline decreases exponentially.

The characteristic impedance $Z_{0\_strip}$ or $Z_{0\_mstrip}$ of the stripline or the micro-stripline has an exponential inverse relationship with the linewidth $W_s$ or $W_m$ of the first or second signal electrode 301 or 401. Thus, the characteristic impedance $Z_{0\_strip}$ or $Z_{0\_mstrip}$ of the stripline or the micro-stripline may be increased or reduced exponentially according to the sum of the linewidth $W_s$ and thickness $t_s$ or linewidth $W_m$ and thickness $t_m$ of the first or second signal electrode 301 or 401, respectively. However, there may be various restrictions on how to realize the linewidths $W_s$ and $W_m$ of the first signal electrode 301 and second signal electrode 401, respectively. For example, due to limitations in processing equipment, there may be a limit in the amount the linewidth $W_s$ and $W_m$ of the respective first and second signal electrodes 301 and 401 can be reduced. For example, there may be a limit to the amount the linewidth $W_s$ and $W_m$ of the respective first and second signal electrodes 301 and 401 may be increased because there is a need to provide a critical dimension (CD). Therefore, it is necessary to minimize the difference between the maximum and minimum values of the characteristic impedance $Z_{0\_strip}$ or $Z_{0\_mstrip}$ of the stripline and/or the micro-stripline due to the limit in increasing the linewidth $W_s$ and $W_m$ of the respective first and second signal electrodes 301 and 401. Also, once the difference between the maximum and minimum values of the characteristic impedance $Z_{0\_strip}$ or $Z_{0\_mstrip}$ of the stripline or the micro-stripline is minimized, it is also necessary to minimize reflection loss by matching the characteristic impedance of each line. For convenience, the first, second, and third ground electrodes 302, 304, and 402 and the first and second dielectrics 303 and 403 of each line are not illustrated in FIGS. 4 through 11, and the linewidth of each line will hereinafter be described as referring to the linewidth $W_s$ or $W_m$ of the first or second signal electrode 301 or 401 of each line.

Referring again to FIG. 1, first through $2^n$-th target devices 300_1 through 300_$2^n$ may be connected to the first through $2^n$-th output terminals OT_1 through OT_$2^n$, respectively. When the target devices 300_1 through 300_$2^n$ are undergoing a test, they may be referred to herein as respective devices under test DUT_1 through DUT-$2^n$.

According to an exemplary embodiment of the present inventive concept, the tester 200 may be automatic test equipment (ATE), but the present inventive concept is not limited thereto. The tester 200 may be connected to the input terminal IT of the test board 100 and may provide the input signal to the input terminal IT of the test board 100. The input line IL of the test board 100 may receive the input signal via the input terminal IT. The input signal received by the input line IL may be provided to the first through $2^n$-th output lines OL_1 through OL_$2^n$ via the branch lines BL and may eventually be provided to the first through $2^n$-th target devices 300_1 through 300_$2^n$. Also, the tester 200 may receive an output signal from each of the first through $2^n$-th target devices 300_1 through 300_$2^n$. The tester 200 may measure the characteristics of each of the first through $2^n$-th target devices 300_1 through 300_$2^n$ using the output signal received from each of the first through $2^n$-th target devices 300_1 through 300_$2^n$.

According to the exemplary embodiment of the present inventive concept depicted in FIG. 1, the device testing apparatus 10 can test the first through $2^n$-th target devices 300_1 through 300_$2^n$ substantially simultaneously. The branch lines BL will hereinafter be described with reference to FIG. 4.

Figure 4:
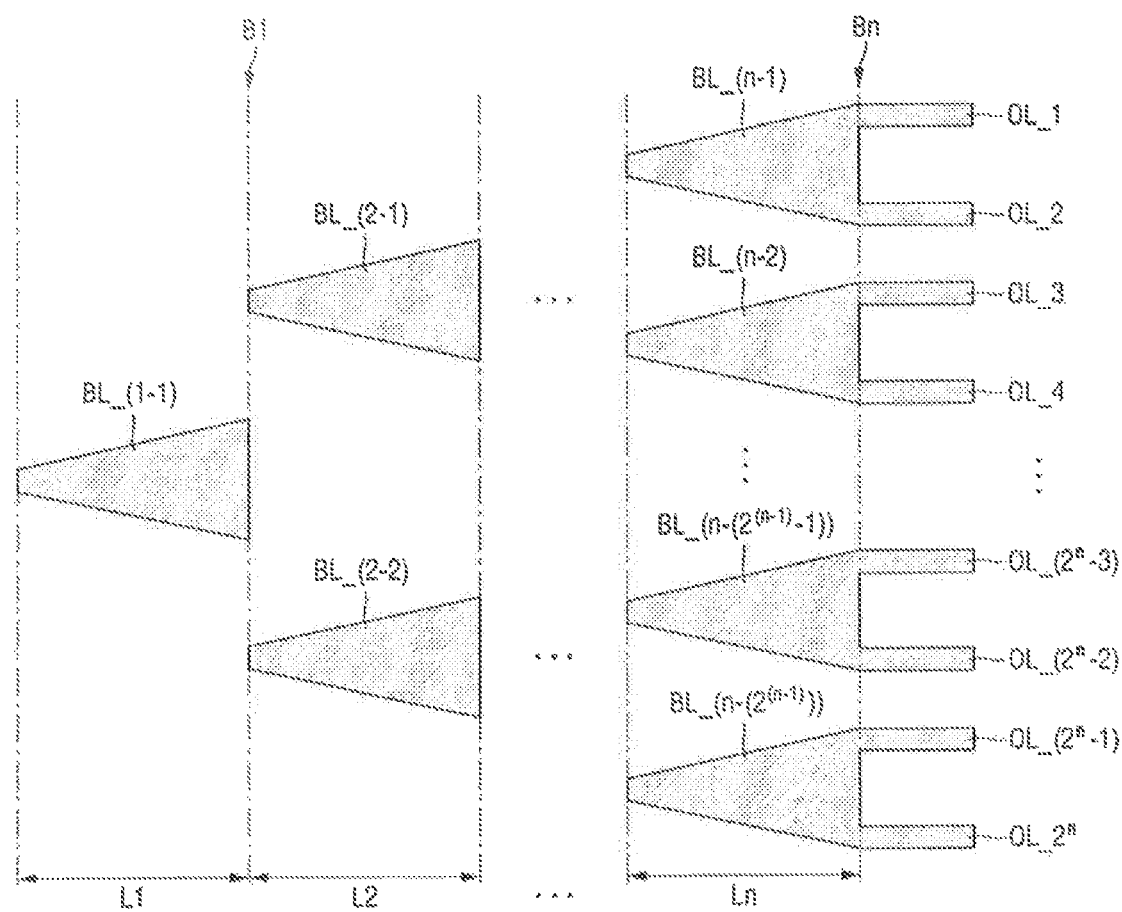
FIG. 4 is a diagram illustrating branch lines according to an exemplary embodiment of the present inventive concept.

FIG. 4 illustrates branch lines according to an exemplary embodiment of the present inventive concept.

Referring to FIG. 4, a plurality of branch lines BL may be provided. For example, a branch line BL_(1-1) may branch into branch lines BL_(2-1) and BL_(2-2). Each of the branch lines BL_(2-1) and BL_(2-2) may branch into multiple branch lines. FIG. 4 illustrates that each of the branch lines BL is branched into multiple branch lines at each of a total of n branch points B1-Bn. The branch points B1-Bn are separated from an immediately preceding branch point by a corresponding pitch of the pitches L1-Ln. For example, at the first branch point B1, the branch line BL_(1-1) may branch into the branch lines BL_(2-1) and BL_(2-2). Similarly, at the n-th branch point Bn, a branch line BL_(n−1) may branch into the first and second output lines OL_1 and OL_2. A branch line BL_(n−2) may branch into the third and fourth output lines OL_3 and OL_4. A branch line BL_(n−(2$^{(n-1)}$−1)) may branch into the (2$^n$-3)- and (2$^n$-2)-th output lines OL(2$^n$-3) and OL_(2$^n$-2). A branch line (BL_(n−(2$^{(n-1)}$)))) may branch into the output lines OL_(2$^n$-1) and OL_2$^n$. For example, when each of the branch lines BL is branched into two branch lines and there are 2$^n$ output lines, the total number of branch lines BL may be 2$^n$−1, and there may be a total number of n branch points. Here, n is a natural number of 2 or greater. For example, the branch line configuration of FIG. 4 may be implemented when there are four or more output lines.

Each of the branch lines BL may have a tapered shape with a length that extends between consecutive, adjacent branch points of the branch points B1-Bn. The length of the branch lines may correspond to a respective pitch of the pitches L1-Ln (herein also referred to as line lengths). For example, the linewidth of the branch lines BL may gradually increase or gradually decrease across a pitch of the pitches L1-Ln. Although FIG. 4 illustrates that the linewidth of the branch lines BL linearly increases or decreases, the present inventive concept is not limited thereto. For example, FIG. 4 illustrates that the linewidth of the branch lines BL may increase or decrease with a constant slope, but the present inventive concept is not limited thereto. According to an exemplary embodiment of the present inventive concept, the linewidth of the branch lines BL may discontinuously (or discretely) increase or decrease. For example, the linewidth of the branch lines BL may increase or decrease in accordance with a predetermined function (e.g., an exponential function, a trigonometric function, a Klopfenstein function, or the like). According to an exemplary embodiment of the present inventive concept, each of the branch lines BL may be tapered and may thus be matched to a characteristic impedance at each branch point. Accordingly, reflection loss can be reduced. Also, in some embodiments, since each of the branch lines BL is matched to characteristic impedance at each branch point, the passband of the input signal may be relatively wide, and this will hereinafter be described with reference to FIG. 5.

Figure 5:
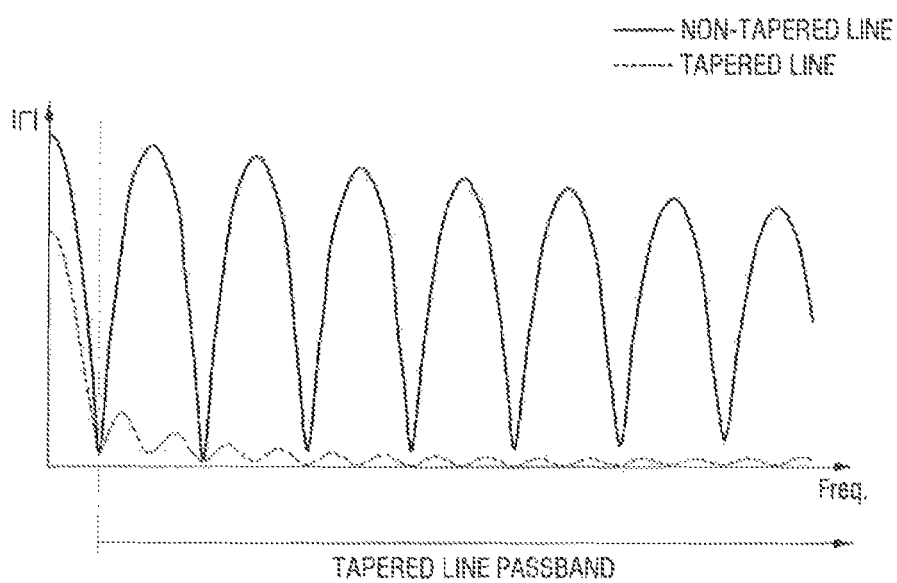
FIG. 5 is a graph illustrating the pass band of the input signal according to an exemplary embodiment of the present inventive concept.

FIG. 5 is a graph illustrating the pass band of the input signal according to an exemplary embodiment of the present inventive concept.

For example, FIG. 5 shows the variation, with frequency, of the reflection coefficient of non-tapered and tapered branch lines "non-tapered line" and "tapered line" with frequency. Referring to FIG. 5, the reflection coefficient of the non-tapered branch line "non-tapered line" fluctuates considerably with frequency. The greater the reflection coefficient is, the larger the reflection loss may become. Thus, if the branch lines BL are not tapered, the device testing apparatus 10 may be used only in a predetermined frequency band due to reflection loss.

If the branch lines BL are tapered, the reflection coefficient of the branch lines BL varies inconsiderably. Thus, if the branch lines BL are tapered, the device testing apparatus 10 can be used in a band of frequencies higher than a predetermined frequency. For example, if the branch lines BL are tapered, the passband of the input signal may be the band of frequencies higher than the predetermined frequency.

Referring again to FIG. 4, branch line lengths L1 through Ln may be used to determine the pass band of the input signal. For example, the pass band of the input signal may be determined by appropriately adjusting the branch line lengths L1 through Ln. The input line IL, the branch lines BL, and the first through $2^n$-th output lines OL_1 through OL_$2^n$ will hereinafter be described with reference to FIG. 6.

Figure 6:
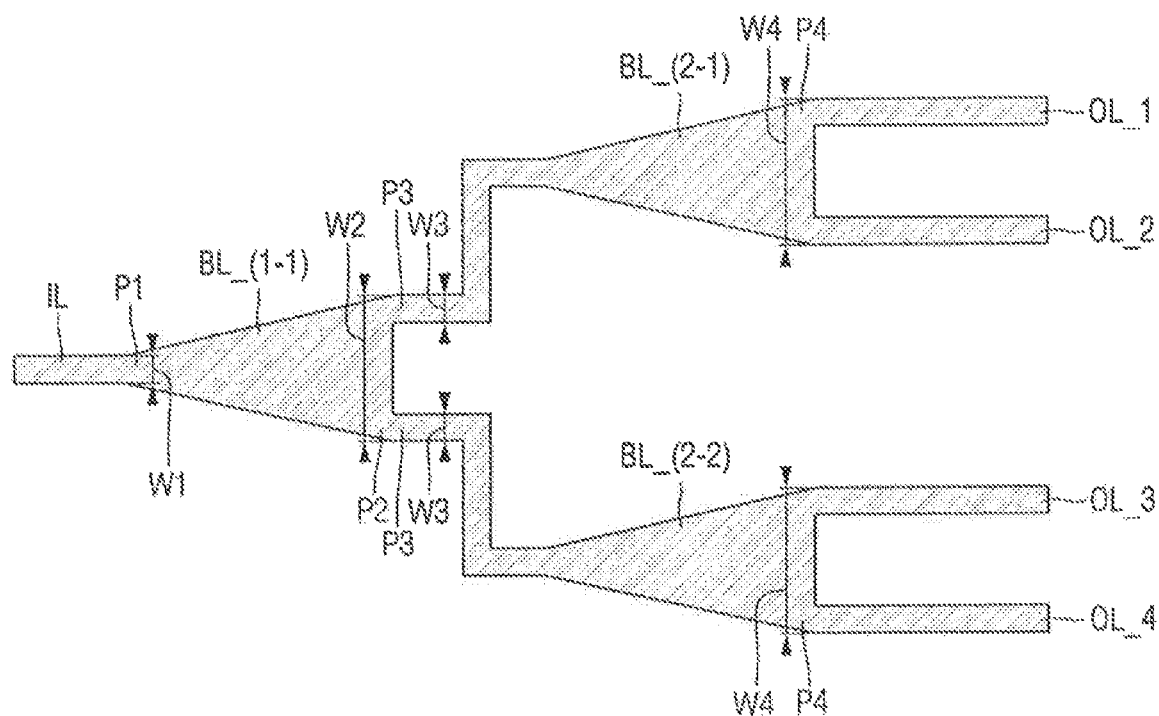
FIG. 6 is a diagram illustrating an input line, branch lines, and output lines according to an exemplary embodiment of the present inventive concept.

FIG. 6 illustrates an input line, branch lines, and output lines according to an exemplary embodiments of the present inventive concept.

For example, FIG. 6 illustrates a case where the total number of branch points is two, i.e., n=2. An input line IL may be expanded to a first linewidth W1. The input line IL may be connected to a branch line BL_(1-1).

The branch line BL_(1-1) may include a first portion P1 which is connected to the input line IL and a second portion P2 which is connected to the first portion P1. The first portion P1 may have the first linewidth W1, and the second portion P2 may have a second linewidth W2. The first linewidth W may be smaller than the second linewidth W2. For example, the branch line BL_(1-1) may have a tapered shape whose linewidth gradually increases in a direction from the first portion P1 to the second portion P2. The branch line BL_(1-1) may branch into branch lines BL_(2-1) and BL_(2-2).

The branch line BL_(2-1) may include a third portion P3 which is connected to the second portion P2 of the branch line BL_(1-1) and a fourth portion P4 which is connected to the third portion P3. The third portion P3 of the branch line BL_(2-1) may have a third linewidth W3, and the fourth portion P4 of the branch line BL_(2-1) may have a fourth linewidth W4. The third linewidth W3 may be smaller than the fourth linewidth W4. For example, the branch line BL_(2-1) may have a tapered shape whose linewidth gradually increases in a direction from the third portion P3 to the fourth portion P4 of the branch line BL_(2-1). According to exemplary embodiment of the present inventive concept, the third width W3 of the branch line BL_(2-1) may be smaller than the second width W2 of the branch line BL_(1-1).

Similarly, the branch line BL_(2-2) may include a third portion P3 which is connected to the second portion P2 of the branch line BL_(1-1) and a fourth portion P4 which is connected to the third portion P3. The third portion P3 of the branch line BL_(2-2) may have the third linewidth W3, and the fourth portion P4 of the branch line BL_(2-1) may have the fourth linewidth W4. The third linewidth W3 may be smaller than the fourth linewidth W4. For example, the branch line BL_(2-2) may have a tapered shape whose linewidth gradually increases in a direction from the third portion P3 to the fourth portion P4 of the branch line BL_(2-2). According to exemplary embodiment of the present inventive concept, the third width W3 of the branch line BL_(2-2) may be smaller than the second width W2 of the branch line BL_(1-1).

The branch line BL_(2-1) may branch into first and second output lines OL_1 and OL_2. The branch line BL_(2-2) may branch into third and fourth output lines OL_3 and OL_4. The first through fourth output lines OL_1 through OL_4 may have substantially a same linewidth. According to exemplary embodiment of the present inventive concept, the linewidth of the first and second output lines OL_1 and OL_2 may be smaller than the fourth linewidth W4 of the branch line BL_(2-1). Similarly, the linewidth of the third and fourth output lines OL_3 and OL_4 may be smaller than the fourth linewidth W4 of the branch line BL_(2-2).

The characteristic impedances of the input line IL, the branch lines BL_(1-1), BL_(2-1), and BL_(2-2), and the first through fourth output lines OL_1 through OL_4 will hereinafter be described with reference to FIG. 7.

Figure 7:
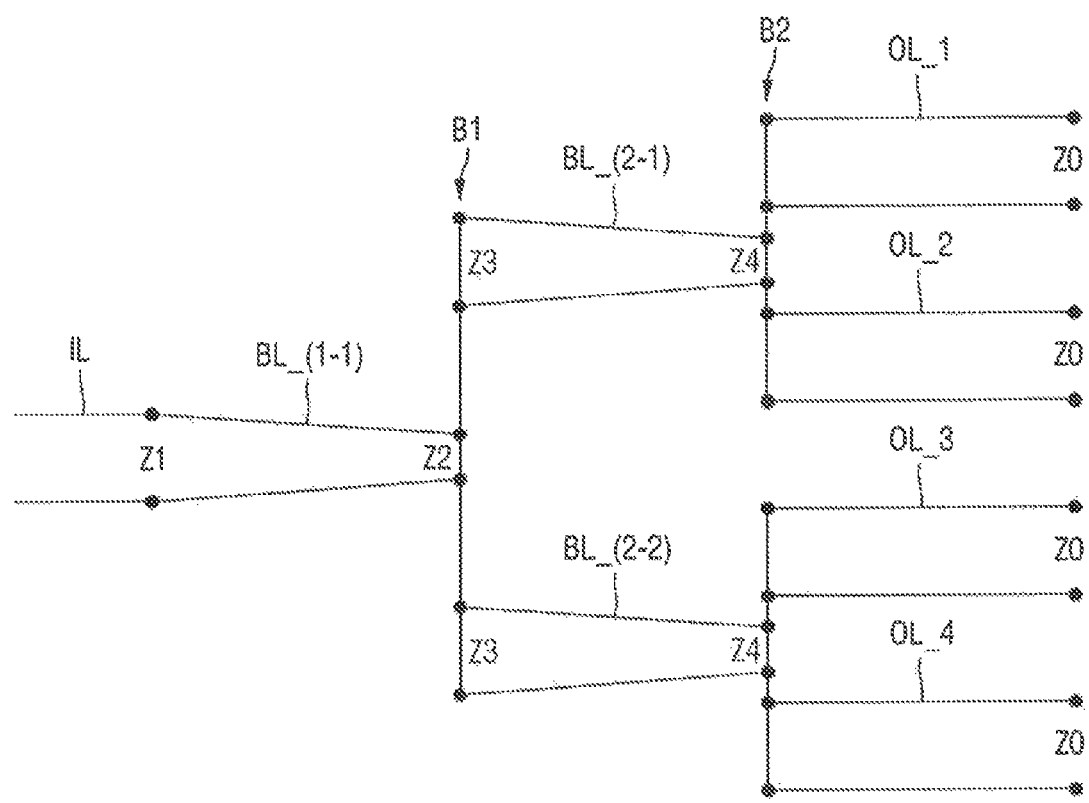
FIG. 7 is a schematic view for explaining the characteristic impedances of the lines of FIG. 6, according to an exemplary embodiment of the present inventive concept.

FIG. 7 is a schematic view for explaining the characteristic impedances of the lines of FIG. 6. Referring to FIG. 7, the width of each line represents characteristic impedance, and the 1s greater the width, the greater the characteristic impedance. The actual linewidth of each line is as already described above with reference to FIG. 6.

Referring to FIGS. 6 and 7, the input line IL may have a first characteristic impedance Z1.

The first portion P of the branch line BL_(1-1) may have the first characteristic impedance Z1, and the second portion P2 of the branch line BL_(1-1) may have a second characteristic impedance Z2. The first characteristic impedance Z1 may be greater than the second characteristic impedance Z2. For example, the characteristic impedance of the branch line BL_(1-1) may decrease in a direction from the first portion P1 to the second portion P2. According to an exemplary embodiment of the present inventive concept, since the input line IL and the first portion P1 of the branch line BL_(1-1) have the same characteristic impedance, reflection loss may be reduced because the characteristic impedances of the input line IL and the branch line BL_(1-1) are matched to each other at a location where the input line IL and the (1-1)-th branch line BL_(1-1) are connected.

At a first branch point B1, the branch line BL_(1-1) may be branched into the (2-1)- and (2-2)-th branch lines BL_(2-1) and BL_(2-2). The third portion P3 of the (2-1)-th branch line BL_(2-1) may have a third characteristic impedance Z3, and the fourth portion P4 of the (2-1)-th branch line BL_(2-1) may have a fourth characteristic impedance Z4. The third characteristic impedance Z3 may be greater than the fourth characteristic impedance Z4. For example, the characteristic impedance of the branch line BL_(2-1) may decrease in the direction from the third portion P3 to the fourth portion P4 of the branch line BL_(2-1). The third portion P3 of the branch line BL_(2-2) may also have the third characteristic impedance Z3, and the fourth portion P4 of the branch line BL_(2-2) may have the fourth characteristic impedance Z4. For example, the characteristic impedance of the branch line BL_(2-2) may decrease from the third portion P3 in the direction to the fourth portion P4 of the branch line BL_(2-2).

According to an exemplary embodiment of the present inventive concept, the characteristic impedance of the second portion P2 of the branch line BL_(1-1) may be the same as the combined characteristic impedance of the third portions P3 of the branch lines BL_(2-1) and BL_(2-2). For example, the second and third characteristic impedances Z2 and Z3 may satisfy Equation (3):

$$Z2 = \frac{Z3}{2} \quad (3)$$

Thus, when signals travel in a direction from the branch line BL_(1-1) to the branch lines BL_(2-1) and BL_(2-2), the characteristic impedance of the branch line BL_(1-1) and the combined characteristic impedance of the branch lines BL_(2-1) and BL_(2-2) may be matched to each other. Accordingly, reflection loss can be reduced at the first branch point B1.

At a second branch point B2, the branch line BL_(2-1) may branch into the first and second output lines OL_1 and OL_2. Also, at the second branch point B2, the branch line BL_(2-2) may branch into the third and fourth output lines OL_3 and OL_4. The first through fourth output lines OL_1 through OL_4 may have the same characteristic impedance as one another. For example, the first through fourth output lines OL_1 through OL_4 may all have an output characteristic impedance Z0.

According to an exemplary embodiment of the present inventive concept, the characteristic impedance of the fourth portion P4 of the branch line BL_(2-1) may be the same as the combined characteristic impedance of the first and second output lines OL_1 and OL_2. For example, the fourth characteristic impedance Z4 and the output characteristic impedance Z0 may satisfy Equation (4):

$$Z4 = \frac{Z0}{2} \quad (4)$$

Thus, when signals travel in a direction from the branch line BL_(2-1) to the first and second output lines OL_1 and OL_2, the characteristic impedance of the (2-1)-th branch line BL_(2-1) and the combined characteristic impedance of the first and second output lines OL_1 and OL_2 may be matched to each other. Accordingly, reflection loss can be reduced at the second branch point B2.

When the first through fourth characteristic impedances Z1 through Z4 and the output characteristic impedance Z0 have a maximum Zmax and a minimum Zmin, the maximum Zmax and the minimum Zmin may satisfy Equation (5):

$$Z\max \geq 2*Z\min \quad (5)$$

The maximum and minimum impedances Zmax and Zmin may be determined by the range of linewidths that can be realized by the input line IL, the branch lines BL_(1-1), BL_(2-1), and BL_(2-2), and the first through fourth output lines OL_1 through OL_4. For example, when maximum and minimum linewidths that can be realized physically are Wmax and Wmin, respectively, the maximum and minimum linewidths Wmax and Wmin are translated into characteristic impedances. If the characteristic impedance corresponding to the minimum linewidth Wmin is the maximum impedance Zmax' and the characteristic impedance corresponding to the maximum linewidth Wmax is the minimum impedance Zmin', a user may determine maximum and minimum impedances Zmax and Zmin that satisfy Equation (5) above and the following inequalities: Zmin'≤Zmin; and Zmax≤Zmax'. For example, the user may determine maximum and minimum impedances Zmax and Zmin that satisfy the following inequality: Zmax'≥Zmax≥2*Zmin≥2*Zmin'.

According to an exemplary embodiment of the present inventive concept, the output characteristic impedance Z0 and the maximum and minimum impedances Zmax and Zmin satisfy Equation (6), the third characteristic impedance Z3 and the maximum and minimum impedances Zmax and Zmin satisfy Equation (7), and the first characteristic impedance Z1 and the maximum and minimum impedances Zmax and Zmin satisfy Equation (8). Equations (6), (7), and (8) are as follows:

$$2*Z\min \leq Z0 \leq Z\max \quad (6)$$

$$2*Z\min \leq Z3 \leq Z\max \quad (7)$$

$$Z\min < Z1 \leq Z\max \quad (8)$$

By using Equations (3) and (7) above, the relationship between the second characteristic impedance Z2 and the maximum and minimum impedances Zmax and Zmin can be deduced, as indicated by Equation (9):

$$Z\min \leq Z2 \leq \frac{Z\max}{2} \quad (9)$$

Similarly, the relationship between the fourth characteristic impedance Z4 and the in maximum and minimum impedances Zmax and Zmin can be deduced from Equations (4) and (6) above and may be represented by Equation (10):

$$Z\min \leq Z4 \leq \frac{Z\max}{2} \quad (10)$$

In some embodiments, reflection loss can be reduced by satisfying Equations (3) and (4) above and matching the characteristic impedances at each branch point. Also, the branch lines BL can be designed within the range of linewidths that can be realized physically, by satisfying Equations (5) through (10) above. For example, once Equations (3) through (10) are satisfied, reflection loss can be minimized within the range of linewidths that can be realized physically. A case where the total number of branch points is three, i.e., n=3, will hereinafter be described with reference to FIGS. 8 and 9.

Figure 8:
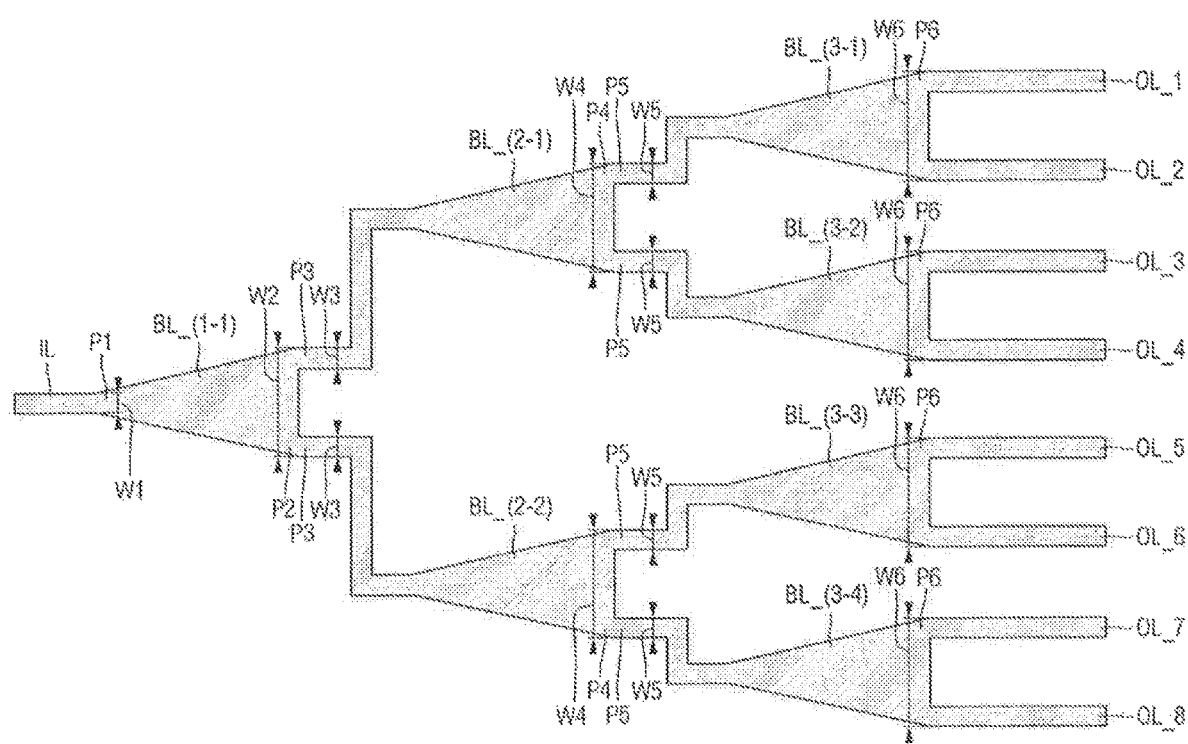
FIG. 8 is a diagram illustrating an input line, branch lines, and output lines according to an exemplary embodiment of the present inventive concept.
Figure 9:
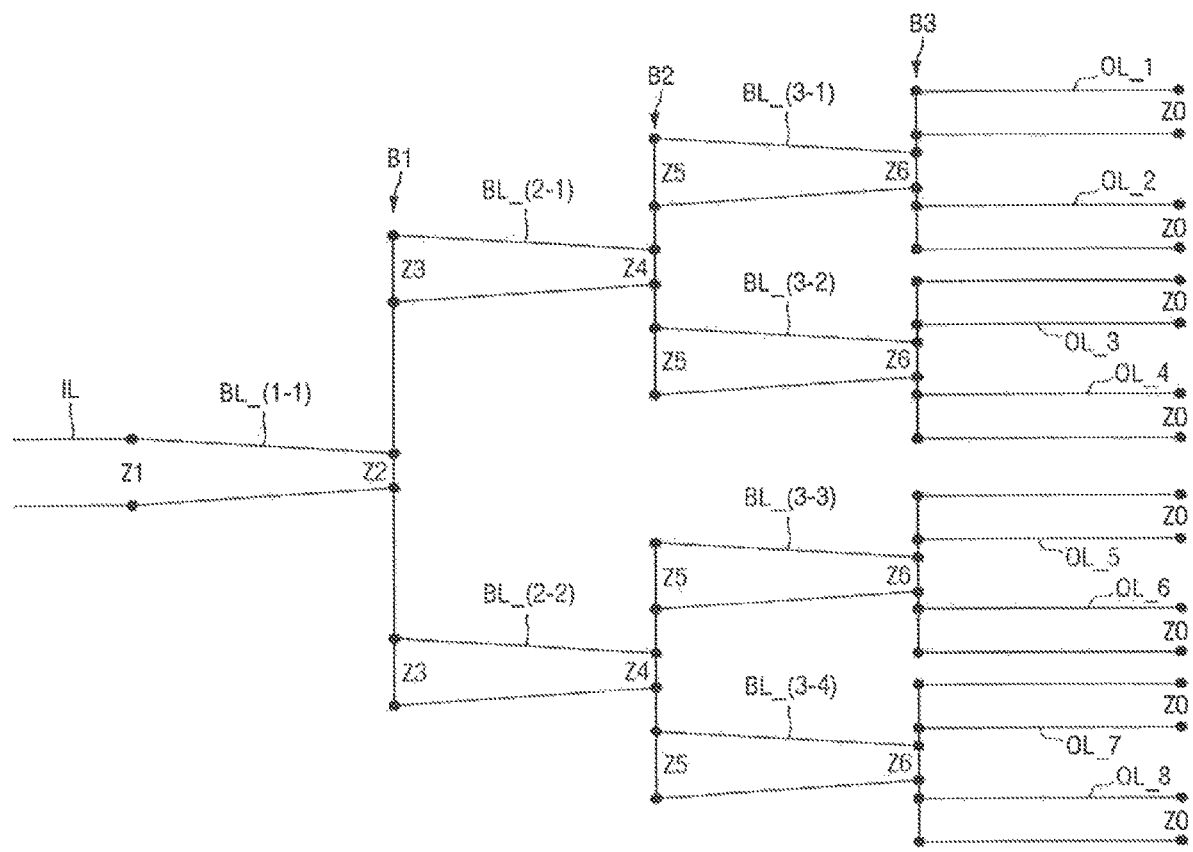
FIG. 9 is a schematic view illustrating the relationships between the characteristic impedances of the lines of FIG. 8, according to an exemplary embodiment of the present inventive concept.

FIG. 8 illustrates an input line, branch lines, and output lines according to an exemplary embodiment of the present inventive concept. FIG. 9 is a schematic view for explaining the relationships between the characteristic impedances of the lines of FIG. 8. For convenience, descriptions of elements and features that have already been described above may be omitted.

Referring to FIG. 8, an input line IL and a branch line BL_(1-1) may be connected to each other, and the branch line BL_(1-1) may have a tapered shape whose linewidth gradually increases in the direction from a first portion P1 to a second portion P2 of the branch line BL_(1-1). A first linewidth W1 of the first portion P1 may be smaller than a second linewidth W2 of the second portion P2.

The branch line BL_(1-1) may be branched into branch lines BL_(2-1) and BL_(2-2). Third portions P3 of the branch lines BL_(2-1) and BL_(2-2) may be connected to the second portion P2 of the branch line BL_(1-1). A third linewidth W3 of the third portions P3 of the branch lines BL_(2-1) and BL_(2-2) may be smaller than a fourth linewidth W4 of fourth portions of the branch lines BL_(2-1) and BL_(2-2). For example, the branch lines BL_(2-1) and BL_(2-2) may have a tapered shape whose linewidth increases in the direction from the third portions P3 to the fourth portions P4 of the branch lines BL_(2-1) and BL_

(2-2). The branch line BL . . . (2-1) may branch into branch lines BL . . . (3-1) and BL . . . (3-2). Fifth portions P5 of the branch lines BL_(3-1) and BL_(3-2) may be connected to the fourth portion P4 of the branch lines BL_(2-1). The branch line BL_(2-2) may branch into branch lines BL_(3-3) and BL_(3-4). Fifth portions P5 of the branch lines BL_(3-3) and BL_(3-4) may be connected to the fourth portion P4 of the branch lines BL_(2-2). A fifth linewidth W5 of the fifth portions P5 of branch lines BL_(3-3) and BL_(3-4) may be smaller than a sixth linewidth W6 of sixth portions P6 of the branch lines BL_(3-3) and BL_(3-4). For example, the branch lines BL_(3-1), BL_(3-2), BL_(3-3), and BL_(3-4) may have a tapered shape whose linewidth increases in a direction from the fifth portions P5 to the sixth portions P6 of the branch lines BL_(3-1), BL_(3-2), BL_(3-3), and BL_(3-4).

The branch line BL_(3-1) may branch into first and second output lines OL_1 and OL_2. The branch line BL_(3-2) may branch into third and fourth output lines OL_3 and OL_4. The branch line BL_(3-3) may branch into fifth and sixth output lines OL_5 and OL_6. The branch line BL_(3-4) may branch into seventh and eighth output lines OL_7 and OL_8. The first through eighth output lines OL_1 through OL_8 may have a smaller width than the sixth linewidth W6.

Referring to FIGS. 8 and 9, the input line IL may have a first characteristic impedance Z1. The first portion P1 of the branch line BL_(1-1) may have the first characteristic impedance Z1, and the second portion P2 of the branch line BL_(1-1) may have a second characteristic impedance Z2. The first characteristic impedance Z1 may be greater than the second characteristic impedance Z2. Since the input line IL and the first portion P1 of the branch line BL_(1-1) have the same first characteristic impedance Z1, the characteristic impedances of the input line IL and the branch line BL_(1-1) are matched to each other at a location where the input line IL and the branch line BL_(1-1) are connected to each other.

At a first branch point B1, the branch line BL_(1-1) may branch into the branch lines BL_(2-1) and BL_(2-2). The third portions P3 of the branch lines BL_(2-1) and BL_(2-2) may have a third characteristic impedance Z3. The fourth portions P4 of the branch lines BL_(2-1) and BL_(2-2) may have a fourth characteristic impedance Z4. The combined characteristic impedance of the third portions P3 of the branch lines BL_(2-1) and BL_(2-2) may be the same as the second characteristic impedance Z2. For example, in some embodiments, Z2=Z3/2. Accordingly, the characteristic impedance of each line at the first branch point B1 can be matched, and as a result, reflection loss can be reduced.

At a second branch point B2, the branch line BL_(2-1) may branch into the branch lines BL_(3-1) and BL_(3-2). Also, at the second branch point B2, the branch line BL_(2-2) may branch into the branch lines BL_(3-3) and BL_(3-4). The fifth portions P5 of the branch lines BL_(3-1) through BL_(3-4) may have a fifth characteristic impedance Z5. The sixth portions P6 of the branch lines BL_(3-1) through BL_(3-4) may have a sixth characteristic impedance Z6. The combined characteristic impedance of the fifth portions P5 of the branch lines BL_(3-1) and BL_(3-2) may be the same as the fourth characteristic impedance Z4 of the fourth portion P4 of the branch line BL_(2-1). The combined characteristic impedance of the fifth portions P5 of the branch lines BL_(3-3) and BL_(3-4) may be the same as the fourth characteristic impedance Z4 of the fourth portion P4 of the (2-2)-th branch line BL_(2-2). For example, according to an exemplary embodiment of the present inventive concept, $$Z4 = \frac{Z5}{2}.$$

Accordingly, the characteristic impedance of each line at the second branch point B2 can be matched, and as a result, reflection loss can be reduced.

At a third branch point B3, the branch line BR._(3-1) may branch into the first and second output lines OL_1 and OL_2. Also, at the third branch point B3, the branch line BL_(3-2) may branch into the third and fourth output lines OL_3 and OL_4. At the third branch point B3, the branch line BL_(3-3) may branch into the fifth and sixth output lines OL_5 and OL_6. At the third branch point B3, the branch line BL_(3-4) may branch into the seventh and eighth output lines OL_7 and OL_8. The first through eighth output lines OL_1 through OL_8 may have an output characteristic impedance Z0. The combined characteristic impedance of the first and second output lines OL_1 and OL_2 may be the same as the sixth characteristic impedance Z6 of the sixth portion P6 of the branch line BL_(3-1). The combined characteristic impedance of the third and fourth output lines OL_3 and OL_4 may be the same as the sixth characteristic impedance Z6 of the sixth portion P6 of the branch line BL_(3-2). The combined characteristic impedance of the fifth and sixth output lines OL_5 and OL_6 may be the same as the sixth characteristic impedance Z6 of the sixth portion P6 of the branch line BL_(3-3). The combined characteristic impedance of the seventh and eighth output lines OL_7 and OL_8 may be the same as the characteristic impedance of the sixth portion P6 of the branch line BL_(3-4). For example, according to an exemplary embodiment of the present inventive concept, $$Z6 = \frac{Z0}{2}$$

Accordingly, the characteristic impedance of each line at the third branch point B3 can be matched, and as a result, reflection loss can be reduced.

According to an exemplary embodiment of the present inventive concept, the number of output lines into which each branch line BL branches may be increased, and multiple branch lines BL may be provided having a tapered shape and sequentially branched. Accordingly, even if the number of output lines into which each branch line BL is branched increases, an excessive linewidth increase or decrease for characteristic impedance matching can be prevented.

According to the exemplary embodiments of the present inventive concept depicted in FIGS. 4 through 9, each branch line BL is branched into a maximum of two lines, but the present inventive concept is not limited thereto. For example, each branch line BL may be branched into a maximum of three lines, and this will hereinafter be described with reference to FIGS. 10 and 11.

Figure 10:
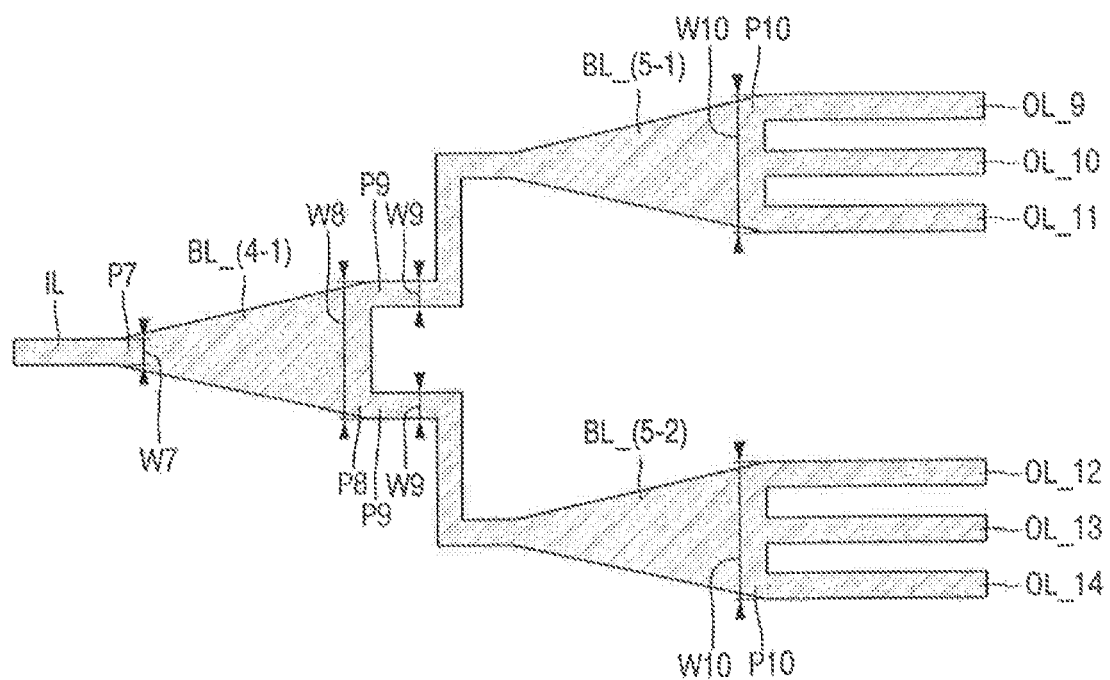
FIG. 10 is a diagram illustrating an input line, branch lines, and output lines according to an exemplary embodiment of the present inventive concept.
Figure 11:
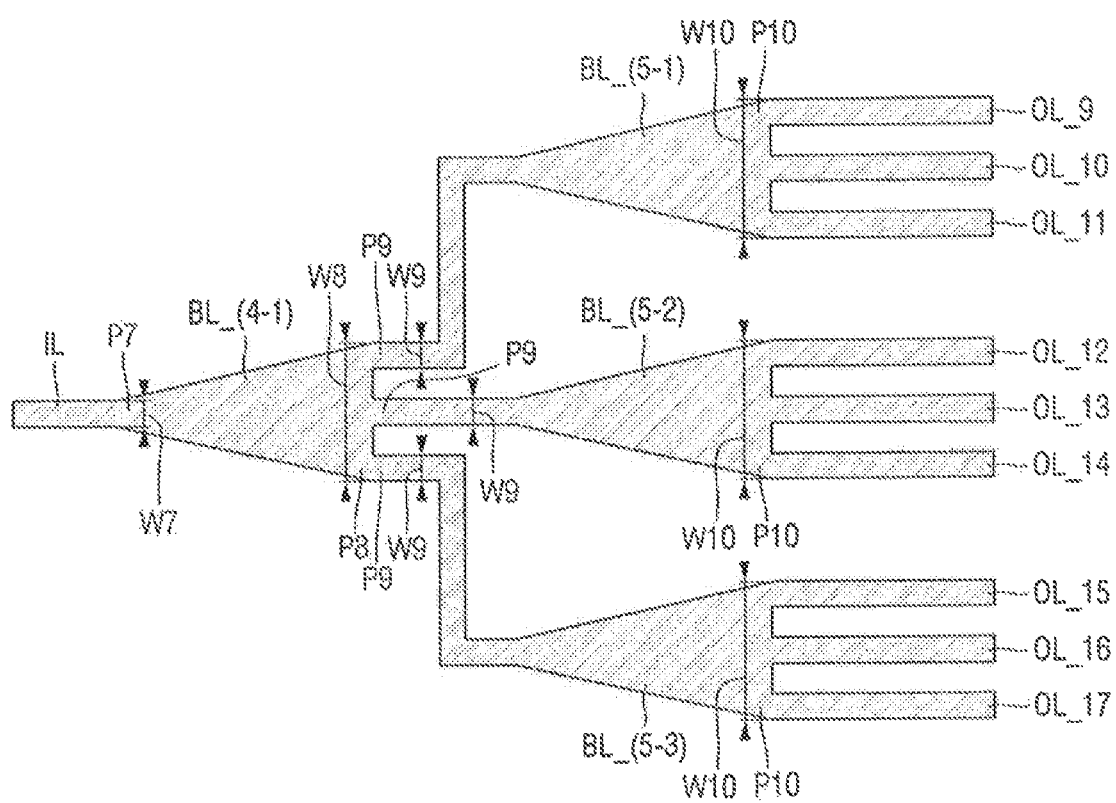
FIG. 11 is a diagram illustrating an input line, branch lines, and output lines according to an exemplary embodiment of the present inventive concept.

FIG. 10 illustrates an input line, branch lines, and output lines according to some embodiments of the present disclosure. FIG. 11 illustrates an input line, branch lines, and output lines according to an exemplary embodiment of the present inventive concept. For convenience, descriptions of elements and features that have already been described above may be omitted.

Referring to FIG. 10, an input line IL may have a seventh linewidth W7. A branch line BL_(4-1) may include a seventh portion P7 which has the seventh linewidth W7 and an eighth portion P8 which is connected to the seventh portion P7 and has an eighth linewidth W8. The seventh portion P7 of the branch line BL_(4-1) may be connected to the input line IL.

The branch line BL_(4-1) may be branched into branch lines BL_(5-1) and BL_(5-2). Each of the branch lines BL_(5-1) and BL_(5-2) may include a ninth portion P9 which has a ninth linewidth W9 and a tenth portion P10 connected to the ninth portion p9 which has a tenth linewidth W10. The ninth portions P9 of the branch lines BL_(5-1) and BL_(5-2) may be connected to the eight portion P8 of the BL_(4-1). The combined characteristic impedance of the branch lines BL_(5-1) and BL_(5-2) may be the same as the characteristic impedance of the eighth portion P8 of the branch line BL_(4-1).

The branch line BL_(5-1) may branch into ninth, tenth, and eleventh output lines OL_9, OL_10, and OL_11. The branch line BL_(5-2) may branch into twelfth, thirteenth, and fourteenth output lines OL_12, OL_13, and OL_14. The ninth through fourteenth output lines OL_9 through OL_14 may have substantially a same linewidth as one another. For example, the ninth through fourteenth output lines OL_9 through OL_14 may have the same characteristic impedance. The combined characteristic impedance of the ninth, tenth, and eleventh output lines OL_9, OL_10, and OL_11 may be the same as the characteristic impedance of the tenth portion P10 of the branch line BL_(5-1). For example, the characteristic impedance of the tenth portion P10 of the branch line BL_(5-1) may be one third of the characteristic impedance of the ninth output line OL_9. Similarly, the combined characteristic impedance of the twelfth, thirteenth, and fourteenth output lines OL_12, OL_13, and OL_14 may be the same as the characteristic impedance of the tenth portion P10 of the branch line BL_(5-2). For example, the characteristic impedance of the tenth portion P10 of the branch line BL_(5-2) may be one third of the characteristic impedance of the twelfth output line OL_2.

Referring to FIG. 11, a branch line BL_(4-1) may branch into branch lines BL_(5-1), BL_(5-2), and BL_(5-3). The branch line BL_(5-1) may branch into ninth, tenth, and eleventh output lines OL_9, OL_10, and OL_1. The branch line BL_(5-2) may branch into twelfth, thirteenth, and fourteenth output lines OL_12, OL_13, and OL_14. The branch line BL_(5-3) may branch into fifteenth, sixteenth, and seventeenth output lines OL_15, OL_16, and OL_17. The ninth through seventeenth output lines OL_9 through OL_17 may have substantially a same linewidth as one another. For example, the ninth through seventeenth output lines OL_9 through OL_17 may have the same characteristic impedance. Each of the branch lines BL_(5-1), BL_(5-2), BL_(5-3) may include a ninth portion P9 which has a ninth linewidth W9 and a tenth portion P10 connected to the ninth portion P9 which has a tenth linewidth W10. The ninth portion P9 of branch lines BL_(5-1) and BL_(5-3) may include a first segment attached to the branch line BL_(4-1) and extending in opposite directions to one another, and a second segment attached thereto that extends in a substantially orthogonal manner and connects to the branch line BL_(5-3). The ninth portion of the branch line BL_(5-2) may be interposed between the branch lines BL_(5-1) and BL_(5-3) and may extend continuously in one direction substantially in parallel to the input line IL. The combined characteristic impedance of the fifteenth, sixteenth, and seventeenth output lines OL_15, OL_16, and OL_17 may be the same as the characteristic impedance of the tenth portion P10 of the branch line BL_(5-3). For example, the characteristic impedance of the tenth portion P10 of the branch line BL_(5-3) may be one third of the characteristic impedance of the fifteenth output line OL_15.

According to an exemplary embodiment of the present inventive concept, when each branch line BL is branched into three lines, the relational expression between Zmax and Zmin may be modified. For example, Zmax≥3*Zmin, and each characteristic impedance condition may vary accordingly.

Figure 12:
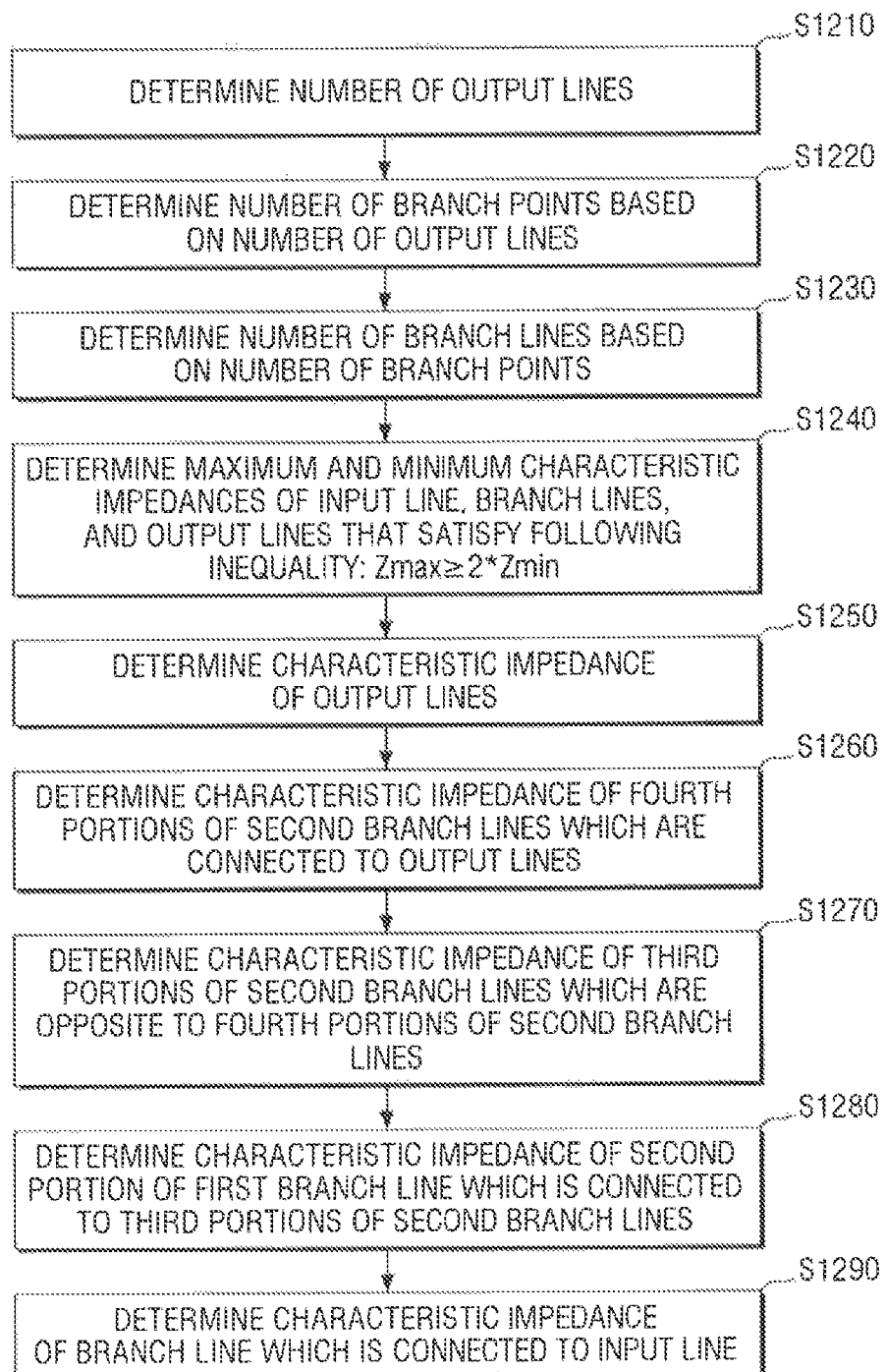
FIG. 12 is a flowchart illustrating a method of fabricating a test board according to an exemplary embodiment of the present inventive concept.

FIG. 12 is a flowchart illustrating a method of fabricating a test board according to an exemplary embodiment of the present inventive concept.

Referring to FIG. 12, the number of output lines is determined (S1210). For example, the number of output lines OL_1-OL_2$^n$ may be determined. For example, the number of output lines may be determined to be 2$^n$.

The number of branch points is determined based on the number of output lines (S1220). For example, when the number of output lines is 2$^n$, the number of branch points may be determined to be n.

Thereafter, the number of branch lines is determined based on the number of branch points (S1230). For example, when the number of output lines is 2$^n$, the number of branch lines may be determined to be (2$^n$−1).

Thereafter, maximum and minimum characteristic impedances Zmax and Zmin of an input line, branch lines, and output lines are determined that satisfy the following inequality: Zmax≥2*Zmin (S1240). For example, as already mentioned above, maximum and minimum linewidths Wmax and Wmin that can be realized physically are determined, and maximum and minimum characteristic impedances Zmax' and Zmin' corresponding to the maximum and minimum linewidths Wmax and Wmin are determined. Thereafter, maximum and minimum characteristic impedances Zmax and Zmin are determined that satisfy the following inequality: Zmax'≥Zmax≥2*Zmin≥2*Zmin'.

Thereafter, the characteristic impedance of the output lines is determined (S1250). An output characteristic impedance Z0 may be determined as indicated by Equation (6) above.

Thereafter, the characteristic impedance of fourth portions of second branch lines which are connected to the output lines is determined (S1260). For example, the characteristic impedance of the fourth portions of the second branch lines is determined to be the same as the combined characteristic impedance of the output lines. For example, referring to FIGS. 6 and 7, the characteristic impedance of the fourth portion P4 of the branch line BL_(2-1), which is connected to the first and second output lines OL_1 and OL_2, e.g., the fourth characteristic impedance Z4, may be determined. For example, the fourth characteristic impedance Z4 may be determined to satisfy the following equation:

$$Z4 = \frac{Z0}{2}.$$

Thereafter, the characteristic impedance of third portions of the second branch lines which are opposite to the fourth portions of the second branch lines is determined (S1270). For example, referring to FIGS. 6 and 7, the characteristic impedance of the third portion P3 of the branch line BL_(2-1), which is opposite to the fourth portion P4 of the branch line BL_(2-1), e.g., the third characteristic impedance Z3, may be determined. For example, the third characteristic impedance 73 may satisfy Equation (7) above.

Thereafter, the characteristic impedance of a second portion of a first branch line which is connected to the third portions of the second branch lines is determined (S1280). For example, the characteristic impedance of the second portion of the first branch line is determined to be the same as the combined characteristic impedance of the second branch lines. For example, referring to FIGS. 6 and 7, the characteristic impedance of the second portion P2 of the branch line BL_(1-1), which is connected to the third portions P3 of the branch lines BL_(2-1) and BL_(2-2), e.g., the second characteristic impedance Z2, may be determined. For example, the second characteristic impedance Z2 may be determined to satisfy the following equation:

$$Z2 = \frac{Z3}{2}.$$

S1270 and S1280 may be repeatedly performed depending on the total number of branch points provided.

Thereafter, the characteristic impedance of a branch line connected to the input line is determined (S1290). For example, the characteristic impedance of the branch line at the site of attachment with the input line may be determined to be matched to the characteristic impedance of the input line. For example, referring to FIGS. 6 and 7, the characteristic impedance of the first portion P1 of the branch line BL_(1-1) may be the same as the characteristic impedance of the input line IL.

Figure 13:
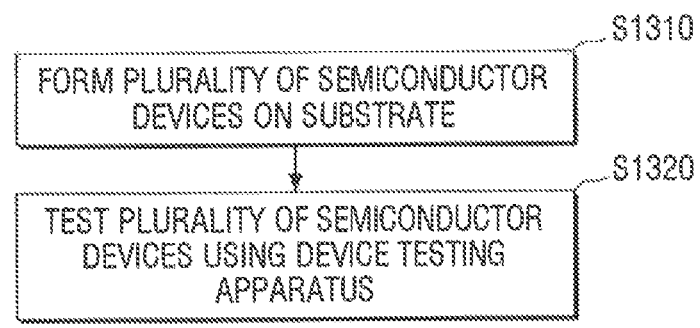
FIG. 13 is a flowchart illustrating a method of manufacturing a semiconductor device using a device testing apparatus, according to an exemplary embodiment of the present inventive concept.

FIG. 13 is a flowchart illustrating a method of manufacturing a semiconductor device using a device testing apparatus according to an exemplary embodiment of the present inventive concept.

Referring to FIG. 13, a plurality of semiconductor devices are formed on a substrate (S1310). For example, the first through $2^n$-th target devices 300_1 through 300_$2^n$ may be formed on the substrate.

The characteristics of the semiconductor devices are tested using the device testing apparatus 10 (S1320). For example, the tester 200 may provide an input signal to the test board 100. The input signal may be branched and provided to the output lines OL_1 through OL_$2^n$ through the branch lines BL. The target devices 300_1 through 300_$2^n$ may receive the input signal through the output lines OL_1 through OL_$2^n$. The tester 200 may receive output signals from the target devices 300_1 through 300_$2^n$ and can thus test the first through $2^n$-th target devices 300_1 through 300_$2^n$ at substantially the same time. However, the present inventive concept is not limited thereto.

While the exemplary embodiments of the present inventive concept have been shown and described above, it will be understood by one of ordinary skill in the art that modifications and variations in form and detail may be made therein without departing from the spirit and scope of the present inventive concept.

What is claimed is:

1. A test board, comprising:
a first branch line including a first portion which receives an input signal and a second portion opposite to the first portion; and
a plurality of second branch lines branching from the first branch line,
wherein each of the second branch lines include a third portion connected to the second portion of the first branch line and a fourth portion connected to the third portion,
wherein a first characteristic impedance of the first portion of the first branch line is different from a second characteristic impedance of the second portion of the first branch line,
wherein a third characteristic impedance of the third portions of each of the second branch lines is different from a fourth characteristic impedance of the fourth portions of each of the second branch lines, and
wherein the second characteristic impedance is equal to a combined characteristic impedance of the third portions of each of the second branch lines.

2. The test board of claim 1, wherein:
each of the second branch lines include first and second sub-branch lines each including the third and fourth portions, and the second characteristic impedance is half of the third characteristic impedance.

3. The test board of claim 2, further comprising:
first and second output lines each connected to the fourth portion of the first sub-branch line; and
third and fourth output lines each connected to the fourth portion of the second sub-branch line.

4. The test board of claim 3, wherein the first through fourth output lines have the same characteristic impedance.

5. The test board of claim 3, wherein:
the fourth characteristic impedance of the first sub-branch line is equal to a combined characteristic impedance of the first and second output lines, and
the fourth characteristic impedance of the second sub-branch line is equal to a combined characteristic impedance of the third and fourth output lines.

6. The test board of claim 2, further comprising:
first, second, and fifth output lines each connected to the fourth portion of the first sub-branch line; and
third, fourth, and sixth output lines each connected to the fourth portion of the second sub-branch line,
wherein the first through sixth output lines have the same characteristic impedance.

7. The test board of claim 6, wherein:
the fourth characteristic impedance of the first sub-branch line is equal to a combined characteristic impedance of the first, second, and fifth output lines, and
the fourth characteristic impedance of the second sub-branch line is the equal to a combined characteristic impedance of the third, fourth, and sixth output lines.

8. The test board of claim 1, wherein:
each of the second branch lines include first, second, and third sub-branch lines each including third and fourth portions, and
the second characteristic impedance is one third of the third characteristic impedance.

9. The test board of claim 8, further comprising:
first, second, and fifth output lines each connected to the fourth portion of the first sub-branch line;
third, fourth, and sixth output lines each connected to the fourth portion of the second sub-branch line; and
seventh through ninth output lines each connected to the fourth portion of the third sub-branch line.

10. The test board of claim 1, further comprising:
an input line connected to the first portion of the first branch line,
wherein a characteristic impedance of the input line is equal to the first characteristic impedance.

11. The test board of claim 1, wherein a maximum characteristic impedance of the first branch line and the plurality of second branch lines is at least twice a minimum characteristic impedance of the first branch line and the second branch lines.

12. The test board of claim 11, wherein the third characteristic impedance is at least twice the minimum characteristic impedance and is less than or equal to the maximum characteristic impedance.

13. The test board of claim 1, wherein the first branch line and the plurality of second branch lines are striplines.

14. The test board of claim 1, wherein the first branch line and the plurality of second branch lines are micro-striplines.

15. A test board comprising:
- first and second output lines connected to first and second target devices, respectively, and having equal characteristic impedance;
- a first branch line including a first portion receiving an input signal and a second portion disposed opposite to the first portion; and
- a second branch line including a third portion connected to the second portion and a fourth portion connected to the first and second output lines,
- wherein a maximum characteristic impedance of the first and second output lines and the first and second branch lines is at least twice a minimum characteristic impedance of the first and second output lines and the first and second branch lines,
- wherein a fourth characteristic impedance of the fourth portion is half of a characteristic impedance of the first and second branch lines,
- wherein a third characteristic impedance of the third portion is at least twice the minimum characteristic impedance and less than or equal to the maximum characteristic impedance, and
- wherein a second characteristic impedance of the second portion is half of the third characteristic impedance.

16. The test board of claim 15, further comprising:
- third and fourth output lines connected to third and fourth target devices, respectively, and having the same characteristic impedance; and
- a third branch line including a fifth portion which is connected to the second portion and a sixth portion which is connected to the third and fourth output lines,
- wherein a sixth characteristic impedance of the sixth portion is half of a characteristic impedance of the third and fourth output lines, and
- wherein a fifth characteristic impedance of the fifth portion is equal to the third characteristic impedance.

17. The test board of claim 15, wherein:
- a first linewidth of the first portion is smaller than a second linewidth of the second portion, and
- a third linewidth of the third portion is smaller than a fourth linewidth of the fourth portion.

18. The test board of claim 15, further comprising:
- an input line receiving the input signal from outside the test board,
- wherein the first portion is connected to the input line.

19. The test board of claim 18, wherein a first characteristic impedance of the first portion is equal to a characteristic impedance of the input line.

20. A device testing apparatus comprising:
- a tester providing an input signal; and
- a test board receiving the input signal, branching the input signal and then providing branched input signals to a plurality of target devices,
- wherein the test board includes an input line which receives the input signal, a first branch line which is branched off of the input line, a second branch line which is branched off of the first branch line, and an output line which is branched off of the second branch line and is connected to the plurality of target devices,
- wherein the first branch line includes a first portion which is connected to the input line and a second portion which is connected to the second branch line,
- wherein the second branch line includes two or more third portions which are connected the first branch line and a fourth portion which is connected to the output line,
- wherein a characteristic impedance of the first portion is different from a characteristic impedance of the second portion,
- wherein a characteristic impedance of the third portion is different from a characteristic impedance of the fourth portion,
- wherein the characteristic impedance of the first portion is equal to a characteristic impedance of the input line, and
- wherein the characteristic impedance of the second portion is equal to the combined characteristic impedance of the two or more third portions.

* * * * *